(12) United States Patent
Chiappetta

(10) Patent No.: US 6,657,570 B1
(45) Date of Patent: Dec. 2, 2003

(54) AUTOMATIC LEVEL CONTROL FOR INPUT TO ANALOG TO DIGITAL CONVERTER

(75) Inventor: Joseph F. Chiappetta, Shelton, CT (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/599,701

(22) Filed: Jun. 22, 2000

(51) Int. Cl.[7] .......................... H03M 1/10; H03M 1/84; H03M 1/12
(52) U.S. Cl. ....................................... 341/120; 341/139
(58) Field of Search ................................ 341/120, 144, 341/139, 172, 155, 161

(56) References Cited

U.S. PATENT DOCUMENTS

| | | | |
|---|---|---|---|
| 4,851,842 A | * 7/1989 | Iwamatsu | 341/139 |
| 5,541,600 A | * 7/1996 | Blumenkrantz et al. | 341/139 |
| 5,630,221 A | 5/1997 | Birleson | |
| 5,748,129 A | * 5/1998 | Tsumura | 341/155 |
| 5,861,831 A | 1/1999 | Murden et al. | |
| 5,960,005 A | 9/1999 | Moteki et al. | |
| 6,150,968 A | * 11/2000 | Tsay et al. | 341/139 |
| 6,204,787 B1 | * 3/2001 | Baird | 341/139 |
| 6,292,120 B1 | 9/2001 | Painchaud et al. | |

OTHER PUBLICATIONS

Patent Abstract of Japan, vol. 015, No. 330, Aug. 22, 1991.

* cited by examiner

Primary Examiner—Jean Bruner Jeanglaude
(74) Attorney, Agent, or Firm—Fogg and Associates, LLC; David N. Fogg; Laura A. Ryan

(57) ABSTRACT

An analog to digital conversion circuit is provided. The analog to digital (A/D) conversion circuit includes an input adapted to receive an analog signal. The A/D conversion circuit further includes a variable attenuator that is coupled to the input and that has a feedback control input. The A/D conversion circuit further includes a converter that is responsive to the variable attenuator and that converts analog input signals to digital output signals. A feedback loop is also provided. The feedback loop is responsive to an overflow indicator of the converter. The feedback loop is adapted to produce a feedback signal based on the overflow indicator and is adapted to provide the feedback signal to the feedback control input of the variable attenuator so as to maintain the peak level of the input to the converter substantially near an acceptable peak input level for the converter.

33 Claims, 2 Drawing Sheets

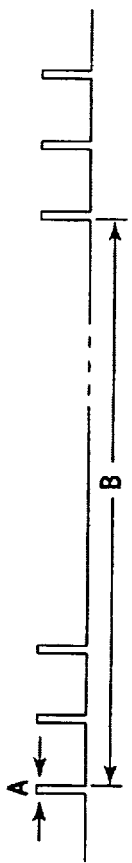
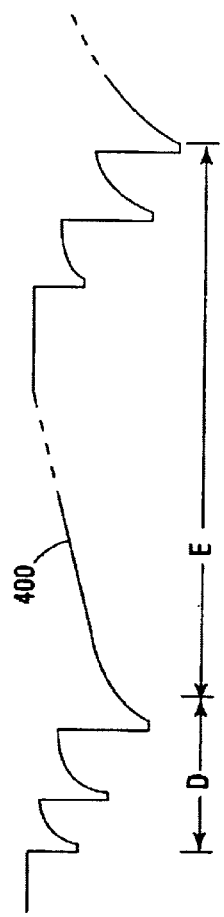
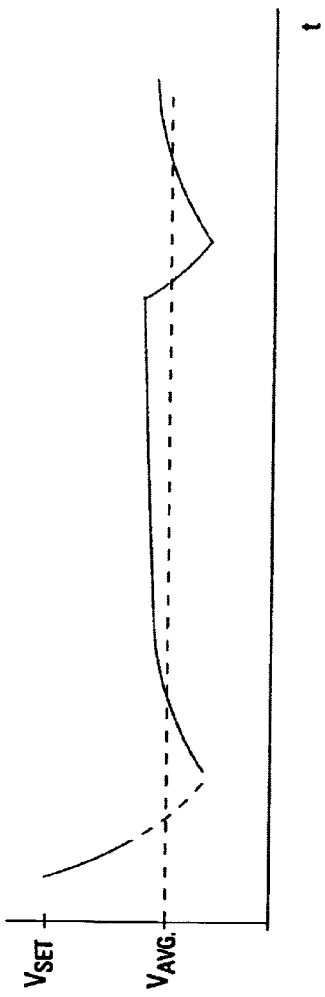
Fig. 2
Fig. 3
Fig. 4
Fig. 5

AUTOMATIC LEVEL CONTROL FOR INPUT TO ANALOG TO DIGITAL CONVERTER

RELATED APPLICATIONS

This application is related to co-pending application Ser. No. 09/517,685, filed on Mar. 2, 2000, entitled "Automatic Gain Control for input to Analog to Digital Converter" (the "'685 Application). The '685 Application is incorporated by reference.

TECHNICAL FIELD

The present invention relates generally to the field of electronics and, in particular, to automatic level control for an input to an analog to digital converter.

BACKGROUND

Analog to digital (A/D) converters are used in a wide variety of electronic circuits. For example, A/D converters are used in high frequency digital transmission systems that receive analog input signals. The A/D converter is an electronic circuit that receives the analog input signal and produces a digital output signal. The digital output signal is produced based on samples of the analog input signal taken over time and processed through a plurality of output registers. The A/D converter samples the digital signal based on a clock signal. In high-speed applications for digital transmission systems, these clock signals typically operate at speeds in the tens to hundreds of megahertz range.

A/D converters are designed to process analog signals over a specified range of analog signal values. When the input signal exceeds the specified peak input signal level, the output registers of the A/D converter overflow. This occurs even when the input voltage exceeds the peak input level by a value that would cause the A/D converter output to exceed its maximum level by a single least significant bit. Further increases beyond this point produce spurious output signals (distortions) that are proportional to the degree of overload of the A/D converter's output registers. The spurious signals can be detrimental to the operation of the digital transmitter. However, if this overload is kept at sufficiently low levels in terms of amplitude and frequency of occurrence, then the resultant distortion can be acceptable in many applications.

To reduce the effect of overflow conditions, some electronic systems are adjusted to operate well below the peak input voltage range of the A/D converter. When initially setting up the system, the input voltage is increased gradually while an overflow register of the A/D converter is monitored. When an overflow condition is reached, the A/D converter provides an output of narrow pulses from the overflow register. The frequency of occurrence of the pulses is typically proportional to the severity of the overflow. Based on the monitored output of the overflow register, the input to the A/D converter is adjusted, e.g., by setting an attenuator, such that the expected maximum input signal will not exceed the peak input range of the A/D converter. In some systems, this adjustment is set at or near 50% of the peak input voltage level. Unfortunately, this reduces the effectiveness of the A/D converter and reduces the signal to noise ratio for the electronic device.

In some circuits, it is desirable to maintain the peak input voltage of the analog signal at or near the maximum value for the range of input signals accepted by the analog to digital converter. Thus, automatic gain control circuits have been used in conjunction with analog to digital converters. Typically, the automatic gain control circuit monitors the input to the analog to digital converter. The automatic gain control circuit further generates a feedback signal based on the monitored input signal. The feedback signal is provided to an amplifier to control the level of the input signal to the analog to digital converter. This feedback signal attempts to keep the peak voltage level of the input signal at or near the full-scale value of the input for the analog to digital converter.

Conventionally, the feedback signal is generated using analog circuitry. For example, such feedback loops typically include one or more of the following analog control blocks: a log amplifier, a summing amplifier, an integrator, and a differentiator. Unfortunately, these analog feedback control loops typically suffer from the so-called "clip" effect. This means that when the input signal exceeds the full-scale input for the analog to digital converter, the control circuitry is unable to quickly reach steady-state operation. Some control loops attempt to use digital circuitry. However, these digital control loops typically suffer from an additional problem relating to the quantization of the control word used to adjust the gain of the input signal for the A/D converter. In this situation, when the control loop reaches a steady state, it tends to introduce an oscillation effect on the input signal to the A/D converter.

For the reasons stated above, and for other reasons stated below which will become apparent to those skilled in the art upon reading and understanding the present specification, there is a need in the art for an improved automatic gain control circuit for an analog to digital converter input.

SUMMARY

The above-mentioned problems with analog to digital converters and other problems are addressed by the present invention and will be understood by reading and studying the following specification. Embodiments of the present invention use automatic level control based on an overflow indicator of an analog to digital converter to maintain a peak level of the input signal for the analog to digital converter substantially near a peak level acceptable by the analog to digital converter.

More particularly, in one embodiment an analog to digital (A/D) conversion circuit is provided. The A/D conversion circuit includes an input adapted to receive an analog signal. The A/D conversion circuit further includes a variable attenuator that is coupled to the input and that has a feedback control input. The A/D conversion circuit further includes a converter that is responsive to the variable attenuator and that converts analog input signals to digital output signals. A feedback loop is also provided. The feedback loop is responsive to an overflow indicator of the converter. The feedback loop is adapted to produce a feedback signal based on the overflow indicator and is adapted to provide the feedback signal to the feedback control input of the variable attenuator so as to maintain the peak level of the input to the converter substantially near an acceptable peak input level for the converter.

BRIEF DESCRIPTION OF THE DRAWINGS

FIGS. 2, 3, 4, and 5 are graphs of timing diagrams for exemplary signals generated for automatic level control of the input to the analog to digital converter of FIG. 1.

DETAILED DESCRIPTION

Figure 1:
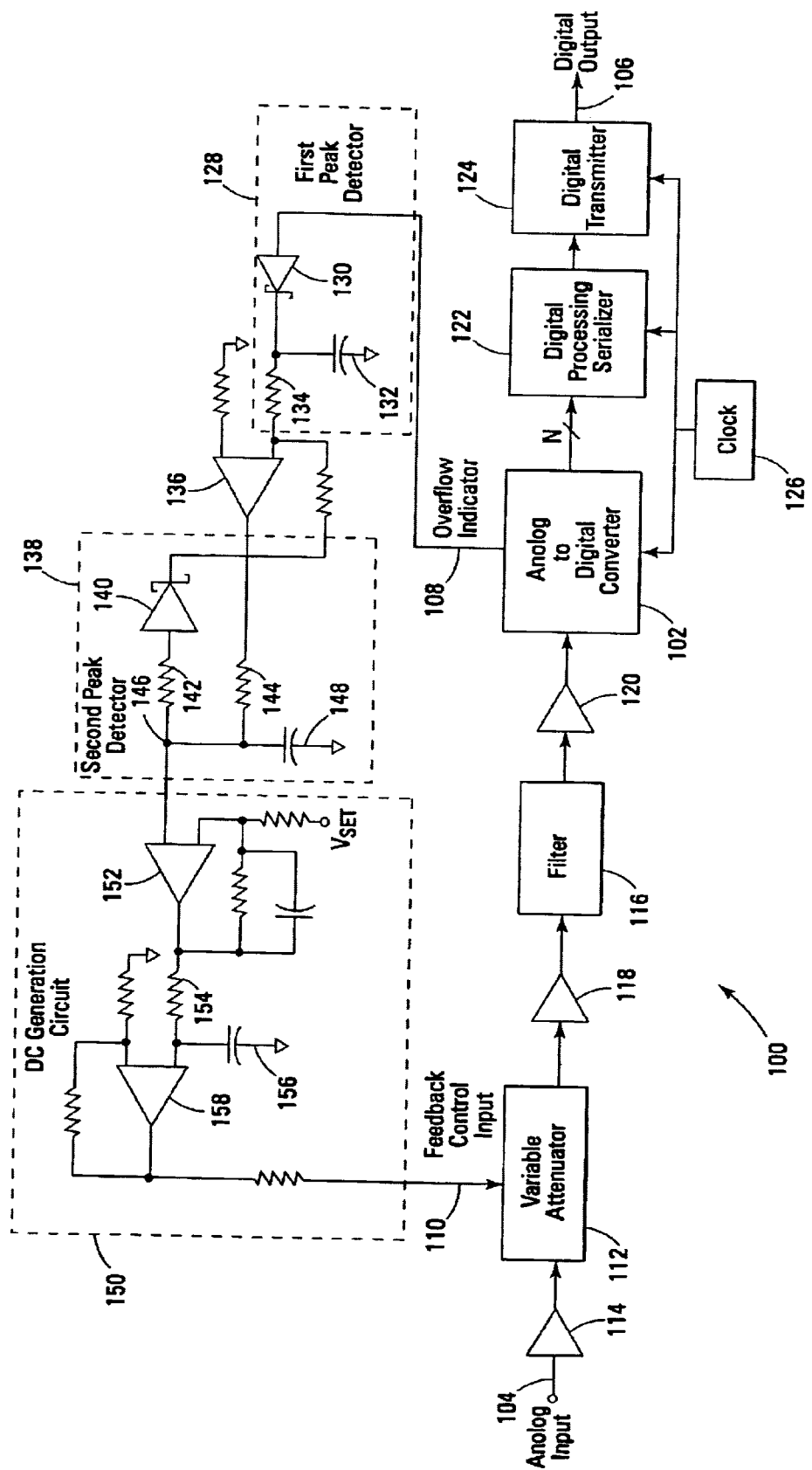
FIG. 1 is a block diagram of an embodiment of a digital transmitter including an analog to digital converter with automatic level control for an input to the analog to digital converter according to the teachings of the present invention.

In the following detailed description, reference is made to the accompanying drawings, which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

FIG. 1 is a block diagram of an embodiment of a digital transmission system, indicated generally and 100, including analog to digital (A/D) converter 102 with automatic level control for an input to A/D converter 102 according to the teachings of the present invention. System 100 includes a main signal path, between analog input 104 and digital output 106, and a feedback path between overflow indicator 108 and feedback control input 110. The feedback path of system 100 and variable attenuator 112 of the main signal path comprise an automatic level control circuit for the input to analog to digital converter 102. Each of these paths is discussed in turn below.

Main Signal Path

The main signal path of system 100 begins at analog input 104. In one embodiment, analog input 104 receives radio frequency (RF) analog signals. Analog input 104 is coupled to variable attenuator 112 through amplifier 114. In one embodiment, variable attenuator 112 comprises an attenuator circuit fabricated from a plurality of PIN diodes coupled in a "pi" or a "T" configuration. In other embodiments, other circuits that provided a controllable attenuation are used in place of the PIN attenuator. Variable attenuator 112 includes feedback control input 110. Variable attenuator 112 is coupled to low pass filter 116 through amplifier 118. Low pass filter 116, in one embodiment, comprises a Nyquist filter with a pass band that is designed to prevent signal aliasing.

The main signal path of system 100 further includes analog to digital converter 102 that is coupled to the output of filter 116 through amplifier 120. Analog to digital converter 102 has a peak input voltage level that is acceptable for producing a non-distorted output. Analog to digital converter 102 includes overflow indicator 108. When the acceptable peak level input to analog to digital converter 102 is exceeded, overflow indicator 108 produces a number of pulses with a frequency of occurrence that is related to the degree of overload and the format of the complex input signal. Analog to digital converter 102 also provides an n-bit output signal to digital processing serializer 122. Serializer 122 provides a serial data stream to digital transmitter 124. Digital transmitter 124 provides an output to digital output 106 for system 100. System 100 also includes clock 126 that provides clocking signals to analog to digital converter 102, serializer 122, and digital transmitter 124.

Feedback Signal Path

The feedback path of system 100 is coupled between overflow indicator 108 of analog to digital converter 102 and feedback control input 110 of variable attenuator 112. The overflow indicator 108 provides an input to first peak detector 128. In one embodiment, first peak detector 128 comprises diode 130, capacitor 132, and resistor 134. Diode 130 receives the input from overflow indicator 108. Capacitor 132 is coupled between an output of diode 130 and ground. Resistor 134 is coupled between an output of diode 130 and a first input of amplifier 136. Values for resistor 134, capacitor 132, and diode 130 are selected to set the dual time constants of first peak detector 128 so as to stretch the duration of pulses in from overflow indicator 108. For example, in one embodiment, first peak detector 128 stretches pulses from overflow indicator 108 from a range of 10 to 50 ns to approximately 300 microseconds. Based on the complexity of the input signal provided to analog to digital converter 102, and the degree of overflow, the frequency of occurrence (period) of the stretched pulses will vary and manifest themselves in bursts of pulses ranging typically from a few microseconds wide to several milliseconds wide. Amplifier 136 inverts, amplifies, and level shifts the output of first peak detector 128.

The feedback path of system 100 further includes second peak detector 138. Second peak detector 138 includes diode 140 coupled to an output of amplifier 136. Second peak detector 138 also includes first and second resistors 142 and 144, respectively. First resistor 142 is coupled between diode 140 and node 146. Second resistor 144 is coupled between an output of amplifier 136 and node 146. Finally, capacitor 148 of second peak detector 138 is coupled between node 146 and ground. The second peak detector 138 is designed with dual time constants that are sufficiently long relative to the burst interval such that second peak detector 138 stretches and effectively integrates both the pulses within the burst interval and the bursts themselves.

Finally, the feedback path of system 100 further includes DC generation circuit 150. Circuit 150 includes non-inverting amplifier 152 that amplifies, filters, and level shifts the output of second peak detector 138. Resistor 154 in combination with capacitor 156 further filters the output of amplifier 152. Circuit 150 further includes amplifier 158 that is coupled to the output of amplifier 152. Amplifier 158 provides a signal to the feedback control input 110 of variable attenuator 112. The operation of system 100 is described with respect to the timing diagrams of FIGS. 2, 3, 4, and 5.

Operation of System 100

In operation, system 100 processes analog signals for transmission as digital signals over an appropriate medium, e.g., a fiber-optic cable. The analog signal is received at input 104. The analog signal is amplified to an appropriate level for analog to digital converter 102 by the combination of variable attenuator 112 and amplifiers 114, 118, and 120. Variable attenuator 112 is controlled so as to assure that the peak voltage level of the analog input signal provided to analog to digital converter 102 is substantially near the acceptable peak level input for analog to digital converter 102.

Analog to digital converter 102 converts the analog signal to a digital output. In one embodiment, the digital output of analog to digital converter 102 comprises an N-bit output signal. The N-bit output signal is converted to a serial signal in serializer 112. Further, digital transmitter 124 transmits the digital signal over an appropriate medium. Analog to digital converter 102, digital processing serializer 122, and digital transmitter 124 are the each controlled by clock 126.

When the input to analog to digital converter 102 exceeds a specified peak voltage level, analog to digital converter 102 produces an overflow indication at overflow indicator 108. This overflow indication comprises a series of pulses.

The frequency of occurrence of the pulses depends on the degree of overload of the analog to digital converter and the format of the complex input signal. An example of an output from overflow indicator 108 is shown by way of example in FIG. 2. In this example, the pulses with, indicated at A, is in the range from 10 to 50 ns. Further, in this example, the period of the pulses, indicated at B, is in the range from 1 to 200 microseconds.

The feedback path of system 100 provides a control signal to variable attenuator 112 so as to selectively control the amplitude of the analog signal provided to analog to digital converter 102 such that a peak level of the analog signal is substantially near the acceptable peak input level for analog to digital converter 102. First peak detector 128 stretches the pulses in overflow indicator 108 from approximately 10 to 50 ns range up to approximately 300 microseconds. Depending on the complexity of the input signal to analog digital converter 102, and the degree of overflow, the frequency of occurrence of the stretched pulses output from first peak detector 128 will vary and manifest themselves in bursts of pulses ranging typically from a few microseconds wide to several milliseconds wide. The output of first peak detector 128, in one example, is shown in FIG. 3 with the stretched pulses with a duration indicated at C. The pulse bursts are inverted, amplified, and level shifted by amplifier 136 to produce an output of the type shown in FIG. 4. In FIG. 4, the portion of waveform 400 identified at D is a burst of stretched pulses ranging typically from a few microseconds wide to several milliseconds wide. Further, the portion of waveform 400 indicated at E represents the pulse burst period that is typically from one to two milliseconds up to tens of milliseconds in duration.

Second peak detector 138 also stretches the input from amplifier 136. Further, due to the nature of its dual time constants, second peak detector 138 effectively integrates both the pulses within the burst interval and the burst themselves. The output of second peak detector 138 is shown, for example, in FIG. 5. This output is essentially a heavily filtered DC voltage with a nominal filtered DC voltage, $V_{AVG}$, that is proportional to the frequency of occurrence of the analog to digital converter overflow as indicated by overflow indicator 108. The output of second peak detector 138 is further refined in DC generation circuit 150 so as to provide a voltage level to feedback control input 110 of variable attenuator 112. Based on the changing input to analog to digital converter 102, amplifier 158 of DC generation circuit 150 provides the appropriate current to variable attenuator 112 to keep the overflow output of the analog to digital converter at a point that will generate minimal and insignificant spurious signals.

CONCLUSION

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, in other embodiments, circuits other than peak detectors are used to condition the output of the overflow register to generate a control signal for an attenuator. Further, in other embodiments, other variable attenuators are used in place of the attenuator based on PIN diodes. In further embodiments, the feedback loop is used with circuits other than digital transmitters. In further embodiments, the input is adapted to receive signals other than RF input signals.

What is claimed is:

1. A digital transmission system, comprising:
   an input for receiving an analog signal;
   an analog to digital converter communicatively coupled to the input, the analog to digital converter for providing an overflow indicator when a peak input level is exceeded by the analog signal; and
   an automatic level control circuit, responsive to a feedback signal comprising the overflow indicator, that is for selectively adjusting the level of the analog signal provided to the analog to digital converter to maintain the peak input level of the analog signal substantially near the peak level acceptable by the analog to digital converter.

2. The system of claim 1, wherein the input is for receiving a radio frequency (RF) input signal.

3. The system of claim 1, wherein the automatic level control circuit includes:
   a variable attenuator, coupled between the input and the analog to digital converter, the variable attenuator having a feedback control input; and
   a feedback loop, responsive to the overflow indicator of the analog to digital converter, for producing a feedback signal based on the overflow indicator and for providing the feedback signal to the feedback control input of the variable attenuator.

4. The system of claim 3, wherein the feedback loop includes:
   a first peak detector, responsive to the overflow indicator, that is for stretching the duration of pulses in the overflow indicator; and
   a second peak detector, responsive to the first peak detector, that is for integrating an output of the first peak detector.

5. The system of claim 3, wherein the feedback loop includes:
   a pair of peak detectors coupled in series that are responsive to the overflow indicator and that stretch and integrate the pulses in the overflow indicator; and
   a DC generation circuit, responsive to the pair of peak detectors, that is adapted to produce a DC control voltage that is provided as the feedback signal to the feedback control input of the variable attenuator.

6. The system of claim 3, wherein the variable attenuator comprises a PIN attenuator.

7. The system of claim 6, wherein the PIN attenuator comprises a PIN attenuator with PIN diodes configured in a "pi" configuration.

8. The system of claim 6, wherein the PIN attenuator comprises a PIN attenuator with PIN diodes configured in a "T" configuration.

9. The system of claim 1, and further comprising a digital serializer, responsive to an output of the analog to digital converter, that converts a parallel output of the analog to digital converter to a serial signal for the digital transmitter.

10. The system of claim 1, and further comprising a digital transmitter, communicatively coupled to an output of the analog to digital converter, that is for transmitting a digital output signal over a selected medium.

11. An analog to digital conversion circuit, comprising:
    an input for receiving an analog signal;
    a variable attenuator, coupled to the input, having a feedback control input;
    a converter, responsive to the variable attenuator, that converts analog input signals to digital output signals; and a feedback loop, responsive to an overflow indicator of the converter, for producing a feedback signal based on the overflow indicator and for providing the feedback signal to the feedback control input of the variable attenuator so as to selectively adjust a peak level of an input to the converter substantially near an acceptable peak input level for the converter.

12. The conversion circuit of claim 11, wherein the feedback loop includes:
 a first peak detector, responsive to the overflow indicator, that is for stretching the duration of pulses in the overflow indicator; and
 a second peak detector, responsive to the first peak detector, that is for integrating an output of the first peak detector.

13. The conversion circuit of claim 11, wherein the feedback loop includes:
 a pair of peak detectors coupled in series that are responsive to the overflow indicator and that stretch and integrate pulses in the overflow indicator; and
 a DC generation circuit, responsive to the pair of peak detectors, that is for producing a DC control voltage that is provided as the feedback signal to the feedback control input of the variable attenuator.

14. The conversion circuit of claim 11, wherein the variable attenuator comprises a PIN attenuator.

15. The conversion circuit of claim 14, wherein the PIN attenuator comprises a PIN attenuator with PIN diodes configured in a "pi" configuration.

16. The conversion circuit of claim 14, wherein the PIN attenuator comprises a PIN attenuator with PIN diodes configured in a "T" configuration.

17. The conversion circuit of claim 11, wherein the input is for receiving a radio frequency (RF) input signal.

18. The conversion circuit of claim 11, and further comprising at least one amplifier and a low pass filter coupled in series between the variable attenuator and the converter.

19. A method for controlling the input to an analog to digital converter, the method comprising:
 receiving an analog signal;
 converting the signal to a digital signal with the analog to digital converter;
 monitoring an overflow indicator of the analog to digital converter; and
 providing a feedback signal to selectively adjust the level of the analog signal provided to the analog to digital converter based on the overflow indicator to maintain the peak input level of the input to the analog to digital converter substantially near an acceptable peak input level for the analog to digital converter.

20. The method of claim 19, wherein receiving an analog signal comprises receiving an analog radio frequency (RF) signal.

21. The method of claim 19, wherein providing a feedback signal comprises converting pulses in the overflow indicator to a DC level that represents the degree to which the analog signal exceeds the peak input level of the analog to digital converter.

22. The method of claim 19, wherein providing a feedback signal comprises: stretching the duration of pulses in the overflow indicator;
 integrating the stretched pulses; and
 generating a DC level from the integrated, stretched pulses that represents the degree to which the analog signal exceeds the peak input level of the analog to digital converter.

23. The method of claim 19, wherein providing a feedback signal comprises providing a signal to a variable attenuator.

24. The method of claim 19, wherein providing a feedback signal comprises providing a signal to control a current level in a plurality of PIN diodes in a variable attenuator.

25. A digital transmission system, comprising:
 an input adapted to receive an analog radio frequency (RF) signal;
 an analog to digital converter communicatively coupled to the input, the analog to digital converter adapted to provide an overflow indicator when a peak input level is exceeded by the analog RF signal;
 an automatic level control circuit, responsive to the overflow indicator, that includes:
  a variable attenuator, coupled between the input and the analog to digital converter, the variable attenuator including a feedback control input,
  a pair of peak detectors coupled in series that are responsive to the overflow indicator and that stretch and integrate pulses in the overflow indicator, and
  a DC generation circuit, responsive to the pair of peak detectors, that is adapted to produce a DC control voltage that is provided as the feedback signal to the feedback control input of the variable attenuator to selectively adjust a level of the analog RF signal provided to the analog to digital converter to maintain the peak level of the analog RF signal substantially near the peak level acceptable by the analog to digital converter;
 a digital serializer, responsive to an output of the analog to digital converter, that converts a parallel output of the analog to digital converter to a serial signal; and
 a digital transmitter, communicatively coupled to digital serializer, that is adapted to transmit a digital output signal over a selected medium.

26. A digital transmission system, comprising:
 an input for receiving an analog signal;
 an analog to digital converter communicatively coupled to the input, the analog to digital converter for providing an overflow indicator when a peak input level is exceeded by the analog signal; and
 an automatic level control circuit, responsive to the overflow indicator, for selectively adjusting the level of the analog signal provided to the analog to digital converter to maintain the peak input level of the analog signal substantially near the peak level acceptable by the analog to digital converter;
 wherein the automatic level control circuit includes:
  a variable attenuator, coupled between the input and the analog to digital converter, the variable attenuator having a feedback control input; and
  a feedback loop, responsive to the overflow indicator of the analog to digital converter, that is for producing a feedback signal based on the overflow indicator and is for providing the feedback signal to the feedback control input of the variable attenuator;
 wherein the feedback loop includes:
  a first peak detector, responsive to the overflow indicator, that is for stretching the duration of pulses in the overflow indicator; and
  a second peak detector, responsive to the first peak detector, that is for integrating the output of the first peak detector.

27. A digital transmission system, comprising:
 an input for receiving an analog signal;

an analog to digital converter communicatively coupled to the input, the analog to digital converter for providing an overflow indicator when a peak input level is exceeded by the analog signal; and an automatic level control circuit, responsive to the overflow indicator, for selectively adjusting the level of the analog signal provided to the analog to digital converter to maintain the peak input level of the analog signal substantially near the peak level acceptable by the analog to digital converter;

wherein the automatic level control circuit includes:
a variable attenuator, coupled between the input and the analog to digital converter, the variable attenuator having a feedback control input;
a feedback loop, responsive to the overflow indicator of the analog to digital converter, that is for producing a feedback signal based on the overflow indicator and is for providing the feedback signal to the feedback control input of the variable attenuator;
wherein the feedback loop includes:
a pair of peak detectors coupled in series that are responsive to the overflow indicator and that stretch and integrate the pulses in the overflow indicator; and
a DC generation circuit, responsive to the pair of peak detectors, that is adapted to produce a DC control voltage that is provided as the feedback signal to the feedback control input of the variable attenuator.

28. A digital transmission system, comprising:
an input for receiving an analog signal;
an analog to digital converter communicatively coupled to the input, the analog to digital converter for providing an overflow indicator when a peak input level is exceeded by the analog signal; and
an automatic level control circuit, responsive to the overflow indicator, for selectively adjusting the level of the analog signal provided to the analog to digital converter to maintain the peak input level of the analog signal substantially near the peak level acceptable by the analog to digital converter;
wherein the automatic level control circuit includes:
a variable attenuator, coupled between the input and the analog to digital converter, the variable attenuator having a feedback control input;
a feedback loop, responsive to the overflow indicator of the analog to digital converter, that is for producing a feedback signal based on the overflow indicator and is for providing the feedback signal to the feedback control input of the variable attenuator;
wherein the variable attenuator comprises a PIN attenuator.

29. The system of claim 28, wherein the PIN attenuator comprises a PIN attenuator with PIN diodes configured in a "pi" configuration.

30. The system of claim 28, wherein the PIN attenuator comprises a PIN attenuator with PIN diodes configured in a "T" configuration.

31. An analog to digital conversion circuit, comprising:
an input for receiving an analog signal;
a variable attenuator, coupled to the input, having a feedback control input;
a converter, responsive to the variable attenuator, that converts analog input signals to digital output signals; and
a feedback loop, responsive to an overflow indicator of the converter, for producing a feedback signal based on the overflow indicator and for providing the feedback signal to the feedback control input of the variable attenuator so as to selectively adjust a peak level of an input to the converter substantially near an acceptable peak input level for the converter;
wherein the feedback loop includes:
a first peak detector, responsive to the overflow indicator, for stretching the duration of pulses in the overflow indicator; and
a second peak detector, responsive to the first peak detector, for integrating the output of the first peak detector.

32. An analog to digital conversion circuit, comprising:
an input for receiving an analog signal;
a variable attenuator, coupled to the input, having a feedback control input;
a converter, responsive to the variable attenuator, that converts analog input signals to digital output signals; and
a feedback loop, responsive to an overflow indicator of the converter, for producing a feedback signal based on the overflow indicator and for providing the feedback signal to the feedback control input of the variable attenuator so as to selectively adjust a peak level of an input to the converter substantially near an acceptable peak input level for the converter;
wherein the feedback loop includes:
a pair of peak detectors coupled in series that are responsive to the overflow indicator and that stretch and integrate the pulses in the overflow indicator; and
a DC generation circuit, responsive to the pair of peak detectors, that is for producing a DC control voltage that is provided as the feedback signal to the feedback control input of the variable attenuator.

33. An analog to digital conversion circuit, comprising:
an input for receiving an analog signal;
a variable attenuator, coupled to the input, having a feedback control input;
a converter, responsive to the variable attenuator, that converts analog input signals to digital output signals; and
a feedback loop, responsive to an overflow indicator of the converter, for producing a feedback signal based on the overflow indicator and for providing the feedback signal to the feedback control input of the variable attenuator so as to selectively adjust a peak level of an input to the converter substantially near an acceptable peak input level for the converter;
further comprising at least one amplifier and a low pass filter coupled in series between the variable attenuator and the converter.

* * * * *